(12) United States Patent
Wang

(10) Patent No.: US 9,584,117 B1
(45) Date of Patent: Feb. 28, 2017

(54) HYBRID RESONANT DRIVER FOR SIC MOSFET

(71) Applicant: TOYOTA MOTOR ENGINEERING & MANUFACTURING NORTH AMERICA, INC., Erlanger, KY (US)

(72) Inventor: Chi-Ming Wang, Ann Arbor, MI (US)

(73) Assignee: TOYOTA MOTOR ENGINEERING & MANUFACTURING NORTH AMERICA, INC., Erlanger, KY (US)

( * ) Notice: Subject to any disclaimer, the term of this patent is extended or adjusted under 35 U.S.C. 154(b) by 0 days.

(21) Appl. No.: 15/075,930

(22) Filed: Mar. 21, 2016

(51) Int. Cl.
*H03K 3/00* (2006.01)
*H03K 17/687* (2006.01)

(52) U.S. Cl.
CPC .................................. *H03K 17/687* (2013.01)

(58) Field of Classification Search
USPC ........................................................ 327/109
See application file for complete search history.

(56) References Cited

U.S. PATENT DOCUMENTS

| | | | |
|---|---|---|---|
| 5,349,514 A | 9/1994 | Ushiki et al. | |
| 5,546,294 A | 8/1996 | Schutten et al. | |
| 5,773,966 A | 6/1998 | Steigerwald | |
| 6,127,746 A | 10/2000 | Clemente | |
| 6,341,078 B1 * | 1/2002 | Miller | H02M 7/5387 363/132 |
| 8,102,192 B2 | 1/2012 | Mourrier et al. | |
| 9,166,488 B2 | 10/2015 | Wu et al. | |
| 2003/0090918 A1 * | 5/2003 | Shenai | H02M 3/1588 363/127 |
| 2009/0273283 A1 * | 11/2009 | Nerone | H05B 41/2827 315/106 |
| 2011/0025937 A1 * | 2/2011 | Yagi | G02F 1/136259 349/39 |
| 2014/0313790 A1 | 10/2014 | Feng et al. | |

OTHER PUBLICATIONS

Lobsiger, Y., et al., "Closed-Loop di/dt and dv/dt IGBT Gate Driver", IEEE Transactions on Power Electronics, vol. 30, No. 6, pp. 3402-3417, (Jun. 2015).

(Continued)

*Primary Examiner* — Lincoln Donovan
*Assistant Examiner* — Patrick Chen
(74) *Attorney, Agent, or Firm* — Oblon, McClelland, Maier & Neustadt, L.L.P.

(57) ABSTRACT

A method including activating a biasing current source which provides a biasing current flowing through a biasing inductor electromagnetically coupled to a resonant inductor; waiting for the resonant inductor to reach a state of saturation; activating a voltage supply for applying a source voltage across a first and a second transistor connected serially, the resonant inductor being connected to a node between the first and second transistors and a driving gate of a driving transistor; determining a first control voltage for applying to a first gate of the first transistor and a second control voltage for applying to a second gate of the second transistor; and applying the first and the second control voltage to the first and the second gate, respectively, the application of the first and the second control voltage sending a current to the driving gate via the resonant inductor activating the driving transistor.

20 Claims, 3 Drawing Sheets

(56) References Cited

OTHER PUBLICATIONS

Oswald, N., et al., "An Experimental investigation of the Tradeoff between Switching Losses and EMI Generation with Hard-Switched All-Si, Si-SiC, and All-SiC Device Combinations", IEEE Transactions on Power Electronics, vol. 29, No. 5, pp. 2393-2407, (May 2014).

De Vries, I.D., "A Resonant Power MOSFET/IGBT Gate Driver", Applied Power Electronics Conference and Exposition, vol. 1, Total 7 Pages, (2002).

Eberle, W., et al.. "A Current Source Gate Driver Achievino Switching Loss Savings and Gate Energy Recovery at 1-MHz", IEEE Transactions on Power Electronics, vol. 23, No. 2, pp. 678-691, (Mar. 2008).

Wang, C.M., "A Revisit to Resonant Gate Driver and a New Driver to Improve EMI vs. loss Tradeoff for SiC MOSFET", Total 3 Pages, (Oct. 2015).

\* cited by examiner

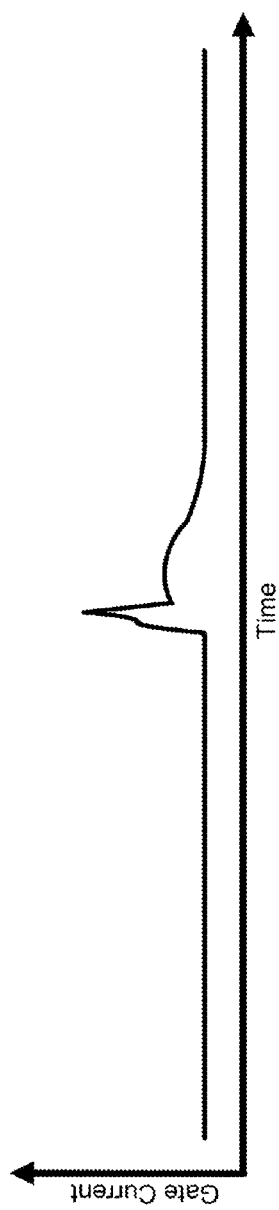
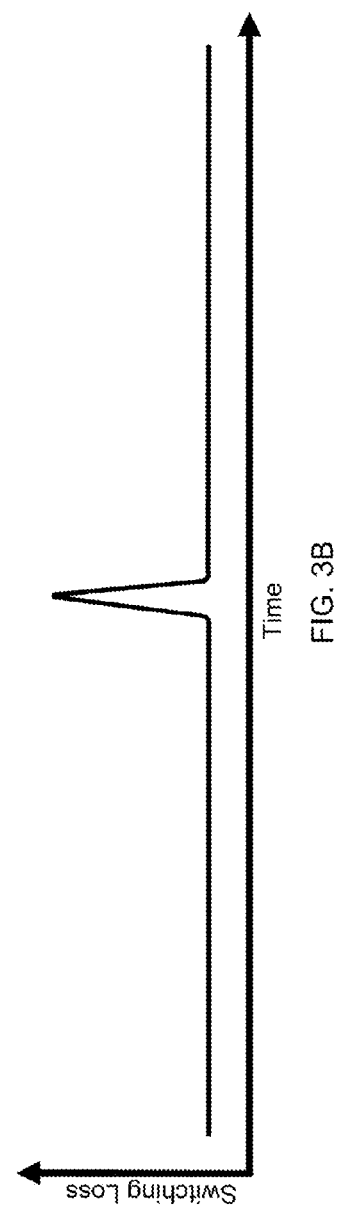
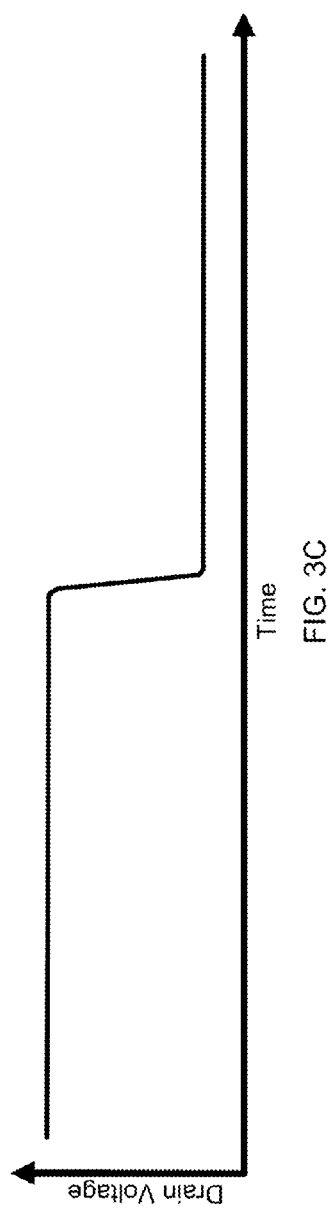

HYBRID RESONANT DRIVER FOR SIC MOSFET

BACKGROUND

Solid state power electronics have numerous industry applications such as automotive, illumination, electricity generation, and heavy machinery. These applications may expose the driving solid state power electronics to thousands of amperes of current and/or thousands of volts of voltage. Due to the large amount of driving current/voltage, the materials and designs of power electronics may differ drastically from convention semiconductor devices. Common device structures include diode, metal-oxide-semiconductor field-effect transistor (MOSFET), bipolar junction transistor (BJT), thyristor, triac, and insulated-gate bipolar transistor (IGBT). Solid state power electronics may be built from semiconductor materials such as silicon, silicon carbide, gallium nitride, or other elemental or compound semiconductor materials.

SUMMARY

Aspects of the disclosure provide a method for driving a Silicon Carbide power device including the steps of activating a biasing current source which provides a biasing current flowing through a biasing inductor electromagnetically coupled to a resonant inductor, waiting for the resonant inductor to reach a state of saturation, activating a voltage supply for applying a source voltage across a first and a second transistor connected serially, the resonant inductor being connected to a node between the first and second transistors and a driving gate of a driving transistor, determining a first control voltage for applying to a first gate of the first transistor and a second control voltage for applying to a second gate of the second transistor, and applying the first and the second control voltage to the first and the second gate, respectively, the application of the first and the second control voltage sending a current to the driving gate via the resonant inductor activating the driving transistor.

Aspects of the disclosure provide circuitry for driving a Silicon Carbide power device including a voltage supply, a first transistor, a first blocking diode, a second blocking diode, and a second transistor connected serially in a closed loop, a drain terminal of the first transistor connected to an anode of the first blocking diode, a cathode of the first blocking diode connected to an anode of the second blocking diode, and a cathode of the second transistor connected to a drain terminal of the second transistor, driving circuitry including a resonant inductor, an output resistor, a driving transistor, the resonant inductor and the output resistor connected serially to a gate of the driving transistor, the resonant inductor connected to the cathode of the first blocking diode, and biasing circuitry including a current source and a biasing inductor electromagnetically coupled to the resonant inductor, the biasing circuitry configured to saturate the resonant inductor flowing a biasing current through the biasing inductor.

Aspects of the disclosure provide a hybrid resonant driver including a supply circuit including a voltage supply, an inverter circuit, and a first diode and a second diode, the voltage supply configured to provide electrical power to the inverter circuit, and the inverter circuit connected serially with the first and the second diode, a cathode of the first diode connected to an anode of the second diode, a driving circuit including a resonant inductor, an input resistor, and a driving transistor, the resonant inductor and the input resistor connected serially to a gate of the driving transistor, the resonant inductor connected to the cathode of the first diode, inductor saturation means for saturating the resonant inductor prior to activating the driving transistor, and controller circuitry connected to the voltage supply, the inverter circuit, and the inductor saturation means, the controller circuitry configured to temporally synchronize a timing for saturating the resonant inductor prior to activating the driving transistor.

BRIEF DESCRIPTION OF THE DRAWINGS

FIGS. 3A, 3B, and 3C illustrate exemplary timing diagrams of the hybrid resonant driver.

DETAILED DESCRIPTION OF EMBODIMENTS

Figure 1:
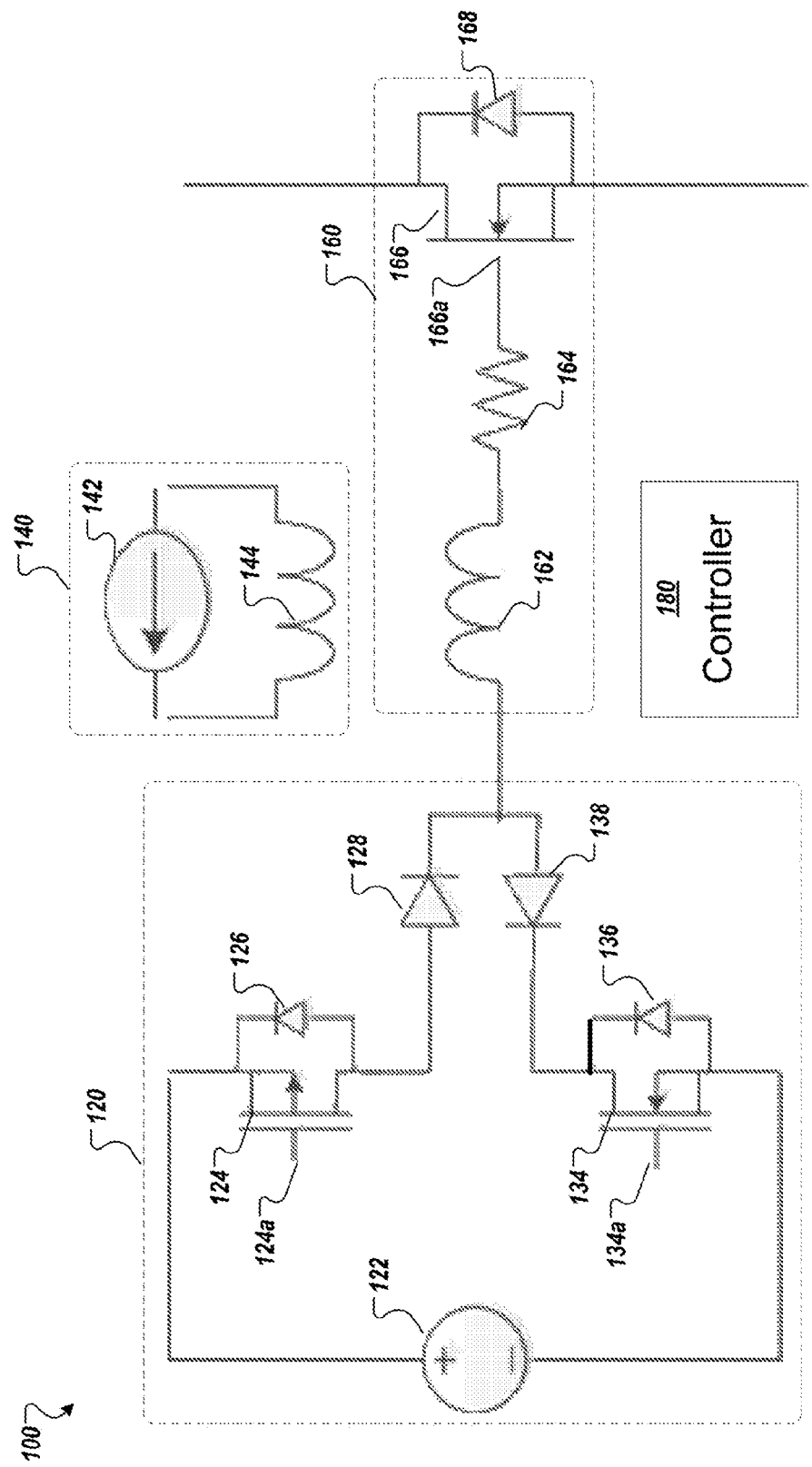
FIG. 1 illustrates an embodiment of a hybrid resonant driver.

FIG. 1 shows an exemplary embodiment of a hybrid resonant driver 100. In some implementations, the hybrid resonant driver 100 includes a voltage source 120, a biasing circuit 140, a power circuit 160 and a controller 180. The hybrid resonant driver 100 may be implemented as a single printed circuit board. For example, a single printed circuit board may mechanically support and electrically interconnect the voltage source 120, the biasing circuit 140, the power circuit 160 and the controller 180.

In some implementations, the voltage source 120 includes a voltage supply 122 for providing electrical power to the voltage source 120. The voltage supply 122 may provide a substantially constant voltage across serially-connected control transistors 124, 134. The control transistor 124 may be a P-type MOSFET and the control transistor 134 may be an N-type MOSFET. While the control transistors 124, 134 are shown to be MOSFET, other device structures are possible, such as bipolar junction transistor. The control transistors 124, 134 may be implemented as enhancement mode devices or depletion mode devices.

The control transistor 124 includes a gate 124a and an intrinsic diode 126. The intrinsic diode 126 may be a parasitic circuit element formed between the drain terminal (not shown) and body (not shown) of the control transistor 124. Similarly, the control transistor 134 includes a gate 134a and an intrinsic diode 136. The intrinsic diode 136 may be a parasitic circuit element formed between drain terminal (not shown) and body (not shown) of the control transistor 134.

In certain embodiments, the voltage source 120 includes diodes 128, 138. The diodes 128, 138 may limit the direction of current flow of the voltage source 120. For example, the diode 128 may allow current to flow from the control transistor 124 toward the power circuit 160. Similarly, the diode 138 may allow current to flow from the power circuit 160 toward the control transistor 134. The diodes 128, 138 may be implemented as P-N junction diodes. Alternatively, the diodes 128, 138 may be implemented as Schottky diodes.

Still referring to FIG. 1, in some embodiments, the biasing circuit 140 includes a biasing current source 142 and a biasing inductor 144 connected in a loop. The biasing current source 142 may provide a substantially constant current through the biasing inductor 144.

In some implementations, the power circuit 160 includes a resonant inductor 162 and a gate impedance 164 connected serially to a gate 166a of a driving transistor 166. The resonant inductor 162 may be electromagnetically coupled to the biasing inductor 144. The inductance values of the resonant and biasing inductors 162, 144 may be substantially identical. For example, the inductance values may be 500 nanohenry (nH). Exemplary inductance values include 50 nH, 100 nH, 250 nH, 500 nH, 750 nH, 1000 nH and 5000 nH. Other values are possible. The inductance ratios of the resonant and biasing inductors 162, 144 may be 1:1. Exemplary inductance ratios of the inductors 162, 144 may be 100:1, 50:1, 20:1, 10:1, 5:1, 2:1, 1:2, 1:5, 1:10, 1:20, 1:50, or 1:100. Other inductance values and ratios are possible. The inductors 162, 144 may be implemented as conductive coils approximately adjacent to each other without the coils being in physical contact.

In some embodiments, the driving transistor 166 may include a diode 168, which may be a freewheeling diode arranged in parallel to the driving transistor 166. Alternatively, the diode 168 may be a combination of a freewheeling diode and an intrinsic diode formed between the body (not shown) and drain (not shown) of the driving transistor 166. While the driving transistor 166 is shown as a MOSFET in FIG. 1, other device structures are possible, such as bipolar junction transistor (BJT), thyristor, triac, high-electron-mobility transistor, junction field effect transistor, metal-semiconductor field effect transistor, and insulated-gate bipolar transistor (IGBT). In an exemplary embodiment, the driving transistor 166 is a Silicon Carbide MOSFET. Alternatively, the driving transistor 166 may be built from semiconductor materials such as silicon, silicon carbide, gallium nitride, or other elemental or compound semiconductor materials.

In some implementations, the driving transistor 166 may be configured to conduct 10 A, 20 A, 50 A, 100 A, or 200 A. The driving transistor 166 may be configured to remain operational under a gate-to-source of 5 V, 10 V, 20 V, 30 V, 40 V, or 50 V. The driving transistor 166 may be configured to remain operational under a drain-to-source voltage of 100 V, 200 V, 500 V, 1000 V, 1200 V, 1500 V, or 2000 V. Other current and voltage limits are possible.

In certain embodiments, the hybrid resonant driver 100 includes the controller 180 for synchronizing the timing for the voltage source 120, the biasing circuit 140, and the power circuit 160. The controller 180 may provide an activation signal to the voltage supply 122. The activation signal may trigger the voltage supply 122 to begin providing electrical power to the control transistors 124, 134. The controller 180 may further provide a first and a second control signal to the gates 124a, 134a of the control transistors 124, 134, respectively. The first and second control signals determine the amount of current flowing through the control transistors 124, 134 by altering the channel resistances of the transistors 124, 134 via the gates 124a, 134a. The first and second control signals may be identical or different. In some implementations, the controller may provide a biasing signal to the biasing current source 142 to control the magnitude of the biasing current.

Figure 2:
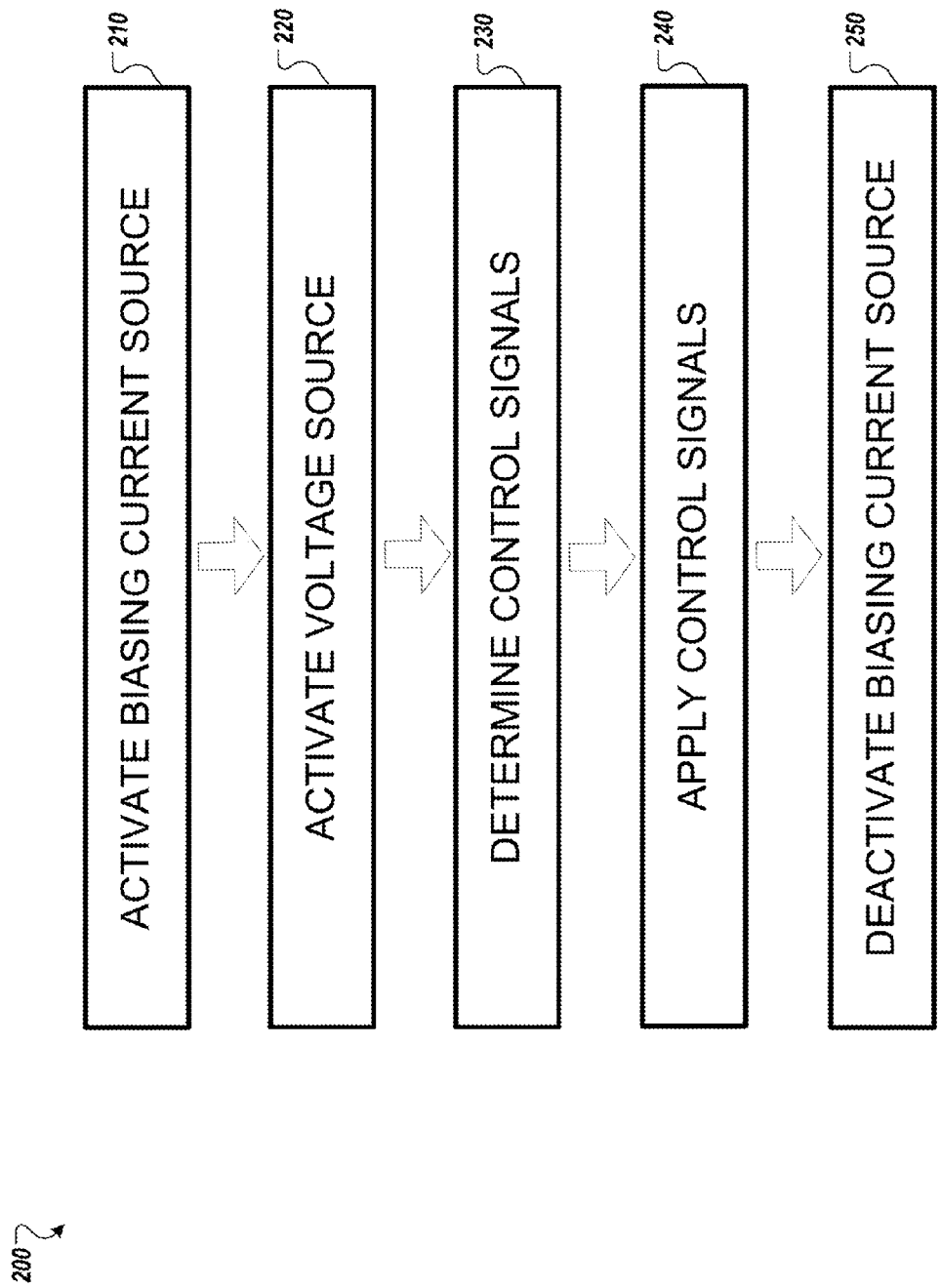
FIG. 2 illustrates a procedure overview of an operation of the hybrid resonant driver.

Turning now to FIG. 2, which illustrates a method of operating the hybrid resonant driver 100, in certain implementations, the controller 180 may provide the biasing signal to activate (210) the biasing current source 142. The biasing signal may be an electrical signal or an optical signal. During normal operation, the controller 180 controls the magnitude of the biasing current provided by the biasing current source 142. For an electrical biasing signal, the controller 180 may alter the current level of the signal to control the biasing current output by the biasing currents source 142. The biasing current source 142 may be configured to change the biasing current depending on the input electrical biasing signal. For example, a biasing signal of 1 mA may result in 1 A of biasing current, a biasing signal of 2 mA may result in 2 A of biasing current, etc. Alternatively, the controller 180 may alter the voltage level of the signal to control the biasing current output by the biasing currents source 142. The biasing current source 142 may be configured to change the biasing current depending on the input electrical biasing signal. For example, a biasing signal at 1 V may result in 1 A of biasing current, a biasing signal 2 V may result in 2 A of biasing current, etc. Other forms of signal control may be possible, such as the frequency or the phase of the biasing signal. For an optical biasing signal, the controller 180 may change the luminance of the biasing signal to control the biasing current output by the biasing current source 142. Other forms of biasing signal may be possible.

In some embodiments, the activated biasing current source 142 may provide a biasing current to the biasing inductor 144. As the biasing current flows through the biasing inductor 144, a magnetic field is generated around the biasing inductor 144, which is electromagnetically coupled to the resonant inductor 162. The generated magnetic field may saturate the resonant inductor 162.

Next, the controller 180 sends the activation signal to the voltage source 120 to activate (220) the source 120. In some implementations, when the voltage supply 122 is activated, at least a portion of a supply current flows from the positive terminal of the voltage supply 122 to the power circuit 160 through the control transistor 124.

In exemplary embodiments, following the activation of the voltage source 120, the controller 180 determines (230) the control signals to be applied to gates 124a, 134a. The control signals may range between a "ceiling" (i.e. "high" or $V_{DD}$) voltage or a "floor" (i.e. "low" or ground) voltage. Exemplary "ceiling" voltages may be 50 V, 40 V, 30 V, 20 V, 10 V, and 5 V. The "floor" voltage may be 0 V. Other voltage values are possible for both. The controls signals may be identical or different.

The control transistor 124 may be a P-type enhancement mode MOSFET and the control transistor 134 may be an N-type enhancement mode MOSFET. If a "ceiling" voltage is applied to the gate 124a, the control transistor 124 may operate in an "off" state. An enhancement mode p-MOSFET operating in the "off" state has a relatively low amount of drain current flowing through its body. Examples of the drain current density in the "off" state include 100 pA-µm$^{-1}$, 1 nA-µm$^{-1}$, 10 nA-µm$^{-1}$, 100 nA-µm$^{-1}$, 1 µA-µm$^{-1}$, and 10 µA-µm$^{-1}$. Other drain current density values are possible in the "off" state. If a "floor" voltage is applied to the gate 124a, the control transistor 124 may operate in an "on" state. An enhancement mode p-MOSFET operating in the "on" state has a relatively high amount of drain current flowing through its body. Examples of the drain current density in the "on" state include 1 µA-µm$^{-1}$, 10 µA-µm$^{-1}$, 100 µA-µm$^{-1}$, 1 mA-µm$^{-1}$, 10 mA-µm$^{-1}$, 100 mA-µm$^{-1}$, 1 mA-µm$^{-1}$, 10 A-µm$^{-1}$, and 100 A-µm$^{-1}$. Other drain current density values are possible in the "on" state.

Similarly, if a "floor" voltage is applied to the gate 134a, the control transistor 134 may operate in an "off" state. An enhancement mode n-MOSFET operating in the "off" state has a relatively low amount of drain current flowing through its body. Examples of the drain current density in the "off" state include 100 pA-µm$^{-1}$, 1 nA-µm$^{-1}$, 10 nA-µm$^{-1}$, 100 nA-µm$^{-1}$, 1 µA-µm$^{-1}$, and 10 µA-µm$^{-1}$. Other drain current density values are possible in the "off" state. If a "ceiling"

voltage is applied to the gate 124a, the control transistor 124 may operate in an "on" state. An enhancement mode n-MOSFET operating in the "on" state has a relatively high amount of drain current flowing through its body. Examples of the drain current density in the "on" state include 1 µA-µm$^{-1}$, 10 µA-µm$^{-1}$, 100 µA-µm$^{-1}$, 1 mA-µm$^{-1}$, 10 mA-µm$^{-1}$, 100 mA-µm$^{-1}$, 1 mA-µm$^{-1}$, 10 A-µm$^{-1}$, and 100 A-µm$^{-1}$. Other drain current density values are possible in the "on" state.

In some embodiments, the controller 180 may apply the control signals at a voltage level between the "floor" and the "ceiling" voltages, or an intermediate voltage. For an application of intermediate voltage on a gate, an enhancement mode transistor may have a drain current between the "on" state current and the "off" state current. In addition to the gate voltage, the amount of drain current may also depend on the drain-to-source voltage.

In certain embodiments, the controller 180 may determine (230) the control voltages based on a target gate current for charging the gate 166a of the driving transistor 166. The target gate current may determine the amount of driving current conducted by the driving transistor 166 by changing the electrical potential within a body of the driving transistor 166.

After determining (230) the appropriate control signals, in some embodiments, the controller 180 applies (240) the predetermined control signals to the gates 124a, 134a of the control transistors 124, 134, which may cause a portion of the source current (i.e. gate current) to flow from the positive terminal of the voltage supply 122 toward the gate 166a of the driving transistor 166. The gate current provided by the voltage supply 122 may charge the gate 166a, and cause the driving transistor 166 to conduct the desired driving current. Since the controller 180 activated (210) the biasing current source 142 before applying (240) the control signals, the biasing inductor 144 already saturated the resonant inductor 162. Hence, the biasing conductor 144 constitutes means for saturating the resonant inductor prior to activating the driving transistor. As a consequence of this configuration, the gate current may experience minimal inductive kick in the resonant inductor 162. With a saturated resonant inductor 162, the turn-on speed for the driving transistor 166 may be increased and the overall switching loss of the hybrid resonant driver 100 may be decreased.

In some implementations, the diode 128 may prevent the unintended discharging of the gate 166a by blocking the gate current from returning to the voltage supply 122 via the intrinsic diode 126.

Next, the controller 180 deactivates (250) the biasing current source 142. The deactivation of the biasing current source 142 may remove the magnetic field produced by the biasing inductor 144, which subsequently eliminates the induced saturation of the resonant inductor 162. During normal operation, the restored resonant inductor 162 may decrease an electromagnetic interference (EMI) caused by the switching of the driving transistor 166.

In certain embodiments, the controller 180 may apply discharging signals to the control transistors 124, 134 to discharge the gate 166a and turn off the driving transistor 166. For example, the controller 180 may apply the "ceiling" voltage to the gates 124a, 134a to discharge the gate 166a. During normal operation, an application of the "ceiling" voltage to the gates 124a, 134a, creates a low resistance path between the gate 166a of the driving transistor 166 and the negative terminal of the voltage supply 122. The charges on the gate 166a discharges through the diode 138 and the control transistor 134. In some implementations, the diode 138 may prevent the unintended charging of the gate 166a by blocking the discharge current from returning to the gate 166a via the intrinsic diode 136.

Referring to FIGS. 3A-3C, FIG. 3A illustrates the gate current of the driving transistor 166. FIG. 3B illustrates the switching loss of the hybrid resonant driver 100, and FIG. 3C illustrates the drain voltage fluctuation of the driving transistor 166 during the activation of the driving transistor 166.

A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components. The functions, processes and algorithms described herein may be performed in hardware or software executed by hardware, including computer processors and/or programmable circuits configured to execute program code and/or computer instructions to execute the functions, processes and algorithms described herein. Additionally, some implementations may be performed on modules or hardware not identical to those described. Accordingly, other implementations are within the scope that may be claimed.

The invention claimed is:

1. A method comprising:
activating a biasing current source which provides a biasing current flowing through a biasing inductor electromagnetically coupled to a resonant inductor;
waiting for the resonant inductor to reach a state of saturation;
activating a voltage supply for applying a source voltage across a first and a second transistor connected serially, the resonant inductor being connected to a node between the first and second transistors and a driving gate of a driving transistor;
determining a first control voltage for applying to a first gate of the first transistor and a second control voltage for applying to a second gate of the second transistor; and
applying the first and the second control voltage to the first and the second gate, respectively, the application of the first and the second control voltage sends a current to the driving gate via the resonant inductor to activate the driving transistor.

2. The method of claim 1, further comprising deactivating the biasing current after the activation of the driving transistor.

3. The method of claim 2, wherein deactivating the biasing current occurs about 10 nanoseconds after the activation of the driving transistor.

4. The method of claim 1, wherein the first and the second control voltage are determined based on an amount of current necessary for activating the driving transistor.

5. The method of claim 1, wherein the driving transistor is a Silicon-Carbide transistor.

6. The method of claim 1, wherein the driving transistor conducts at least 100 A at 1200 V.

7. A circuit comprising:
a voltage source including a voltage supply, a first transistor, a first blocking diode, a second blocking diode, and a second transistor connected serially in a closed loop, a drain terminal of the first transistor connected to an anode of the first blocking diode, a cathode of the first blocking diode connected to an anode of the second blocking diode, and a cathode of the second transistor connected to a drain terminal of the second transistor;

driving circuitry including a resonant inductor, an output resistor, a driving transistor, the resonant inductor and the output resistor connected serially to a gate of the driving transistor, the resonant inductor connected to the cathode of the first blocking diode; and biasing circuitry including a current source and a biasing inductor electromagnetically coupled to the resonant inductor, the biasing circuitry configured to saturate the resonant inductor by flowing a biasing current through the biasing inductor.

8. The circuit of claim 7, wherein the first transistor is p-type and the second transistor is n-type.

9. The circuit of claim 7, wherein the biasing circuit saturates the resonant inductor prior to activating the driving transistor.

10. The circuit of claim 9, further comprising a controller configured to temporally synchronize the saturation of the resonant inductor and the activation of the driving transistor.

11. The circuit of claim 7, wherein the driving transistor is a Silicon Carbide transistor.

12. The circuit of claim 7, wherein an inductance of the resonant inductor is substantially 500 nanohenry.

13. The circuit of claim 7, wherein the voltage source, the driving circuitry, and the biasing circuit are implemented on an integrated printed circuit board.

14. A hybrid resonant driving circuit, comprising:

a supply circuit including a voltage supply, an inverter circuit, and a first diode and a second diode, the voltage supply configured to provide electrical power to the inverter circuit, and the inverter circuit connected serially with the first and the second diode, a cathode of the first diode connected to an anode of the second diode;

a driving circuit including a resonant inductor, an input resistor, and a driving transistor, the resonant inductor and the input resistor connected serially to a gate of the driving transistor, the resonant inductor connected to the cathode of the first diode;

inductor saturation means for saturating the resonant inductor prior to activating the driving transistor; and controller circuitry connected to the voltage supply, the inverter circuit, and the inductor saturation means, the controller circuitry configured to temporally synchronize a timing for saturating the resonant inductor prior to activating the driving transistor.

15. The hybrid resonant driving circuit of claim 14, wherein the driving transistor is a Silicon Carbide metal-oxide-semiconductor field-effect transistor.

16. The hybrid resonant driving circuit of claim 14, wherein the driving transistor conducts at least 100 A at 1200 V.

17. The hybrid resonant driving circuit of claim 14, wherein the controller circuitry disables the inductor saturation means after activating the driving transistor.

18. The hybrid resonant driving circuit of claim 14, wherein the supply circuit, the driving circuit, the inductor saturation means, and the controller are integrated onto a single printed circuit board.

19. The hybrid resonant driving circuit of claim 14, wherein the inverter circuit includes a first transistor and a second transistor, and the controller circuit is configured to respectively transmit a control signal to gates of the first and the second transistor.

20. The hybrid resonant driving circuit of claim 19, wherein the controller circuitry determines a voltage level of the control signal depending on the amount of current driven by the driving transistor.

* * * * *